United States Patent
Cho

(10) Patent No.: US 7,767,530 B2
(45) Date of Patent: Aug. 3, 2010

(54) TRANSISTOR HAVING RECESS CHANNEL AND FABRICATING METHOD THEREOF

(75) Inventor: Cheol-Ho Cho, Chungcheongbuk-do (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 187 days.

(21) Appl. No.: 11/898,991

(22) Filed: Sep. 18, 2007

(65) Prior Publication Data
US 2008/0150015 A1      Jun. 26, 2008

(30) Foreign Application Priority Data
Dec. 26, 2006   (KR) ................... 10-2006-0133855

(51) Int. Cl.
*H01L 29/94* (2006.01)

(52) U.S. Cl. ................ 438/270; 257/E29.345; 257/E21.409; 257/330

(58) Field of Classification Search ......... 438/270–271, 438/134; 257/328–333, 339, 476, 565
See application file for complete search history.

(56) References Cited

U.S. PATENT DOCUMENTS

| | | | | |
|---|---|---|---|---|
| 5,358,695 A * | 10/1994 | Helble et al. | ................ | 423/263 |
| 5,424,231 A * | 6/1995 | Yang | ........................... | 438/270 |
| 5,512,509 A * | 4/1996 | Han | ............................. | 438/446 |
| 5,637,898 A * | 6/1997 | Baliga | .......................... | 257/330 |
| 5,998,833 A * | 12/1999 | Baliga | .......................... | 257/330 |
| 6,875,657 B2 | 4/2005 | Yue et al. | ..................... | 438/270 |
| 6,900,100 B2 * | 5/2005 | Williams et al. | ............ | 438/259 |
| 2002/0153558 A1 | 10/2002 | Takemori et al. | | |
| 2006/0220083 A1 * | 10/2006 | Abe | .............................. | 257/295 |
| 2008/0113500 A1 * | 5/2008 | Kim et al. | ..................... | 438/589 |

FOREIGN PATENT DOCUMENTS

| | | |
|---|---|---|
| JP | 2004-303802 | 10/2004 |
| KR | 2006-0128472 | 12/2006 |

* cited by examiner

*Primary Examiner*—David Vu
*Assistant Examiner*—Jonathan Han
(74) *Attorney, Agent, or Firm*—DLA Piper LLP US

(57) ABSTRACT

A transistor includes a substrate including a trench, an insulation layer filled in a portion of the trench, the insulation layer having a greater thickness over an edge portion of a bottom surface of the trench than over a middle portion of the bottom surface of the trench, a gate insulation layer formed over inner sidewalls of the trench, the gate insulation layer having a thickness smaller than the insulation layer, and a gate electrode filled in the trench.

10 Claims, 8 Drawing Sheets

TRANSISTOR HAVING RECESS CHANNEL AND FABRICATING METHOD THEREOF

CROSS-REFERENCE TO RELATED APPLICATIONS

The present invention claims priority of Korean patent application number 10-2006-0133855, filed on Dec. 26, 2006, which is incorporated by reference in its entirety.

BACKGROUND OF THE INVENTION

The present invention relates to a method for fabricating a semiconductor device, and more particularly, to a method for fabricating a metal-oxide semiconductor field effect transistor (MOSFET) having a recess channel.

A typical semiconductor device has adopted an individual device, such as a MOSFET device, as a switching device. Accordingly, the size of the MOSFET device has decreased as the semiconductor device becomes highly integrated. As a result, in the MOSFET device having a horizontal channel, which is a typical structure, normal operations have become difficult to perform because of a short channel effect (SCE) and a drain induced barrier lower (DIBL) effect derived from the reduced channel length between a source and a drain.

Thus, a MOSFET device having a recess channel (hereinafter referred to as a recess transistor) has been introduced to overcome the limitation of the MOSFET device having the horizontal channel. The recess transistor includes a structure in which a gate is filled in a trench formed in an active region of a substrate. Such recess transistor can reduce the SCE and the DIBL effect by lengthening the channel length even if the scale of integration increases in the device.

FIG. 1 illustrates a cross-sectional view of a typical recess transistor. A cross-sectional view of a double diffused metal-oxide semiconductor (DMOS) is illustrated herein as an example for convenience of description.

The typical DMOS device includes a doped $N^+$ substrate (drain) 10, an N-epitaxial layer 11 doped at a lower concentration than the substrate 10, a gate electrode 13 comprising a conductive polysilicon layer filled in a trench, a gate oxide layer 12 formed to a uniform thickness on an inner surface of the trench below the gate electrode 13, an $N^+$ doped source region 14 formed on both upper sides of the gate electrode 13, and a planarized P-well 15 formed below the $N^+$ doped source region 14. Also, a source metal layer 16 formed to cover the $N^+$ doped source region 14 and a dielectric layer 17 formed below the source metal layer 16 to cover the gate electrode 13 are further included. Reference denotation 'T1' refers to a thickness 'T1' of a portion of the gate oxide layer 12 formed at a bottom portion of the trench.

However, a gate capacitance may increase in the typical DMOS device because the gate oxide layer 12 is form to a small uniform thickness on inner sidewalls and a bottom surface of the trench. Accordingly, there are limitations in improving a switching speed of the DMOS device functioning as a switching device.

SUMMARY OF THE INVENTION

Embodiments of the present invention are directed to provide a recess transistor and a method for fabricating the same, which can improve a switching speed of a device by reducing a gate capacitance.

In accordance with an aspect of the present invention, there is provided a transistor, including: a substrate including a trench; an insulation layer filled in a portion of the trench, the insulation layer having a greater thickness over an edge portion of a bottom surface of the trench than over a middle portion of the bottom surface of the trench; a gate insulation layer formed over inner sidewalls of the trench, the gate insulation layer having a thickness smaller than the insulation layer; and a gate electrode filled in the trench.

In accordance with another aspect of the present invention, there is provided a transistor, including: a substrate including a trench; an insulation layer filled in a portion of the trench, the insulation layer having a V shape; a gate insulation layer formed over inner sidewalls of the trench, the gate insulation layer having a thickness smaller than the insulation layer; and a gate electrode filled in the trench.

In accordance with still another aspect of the present invention, there is provided a method for fabricating a transistor, including: forming a trench in a substrate; forming a polysilicon layer over the substrate and filled in the trench; etching the polysilicon layer in a manner that a portion of the polysilicon layer having a greater thickness over an edge portion of a bottom surface of the trench than over a middle portion of the bottom surface of the trench remains in the trench; oxidizing the remaining portion of the polysilicon layer to form an insulation layer over the bottom surface of the trench and forming a gate insulation layer over inner sidewalls of the trench to a smaller thickness than the insulation layer at substantially the same time; and forming a gate electrode over the insulation layer and filled in the trench.

DESCRIPTION OF SPECIFIC EMBODIMENTS

Figure 1:
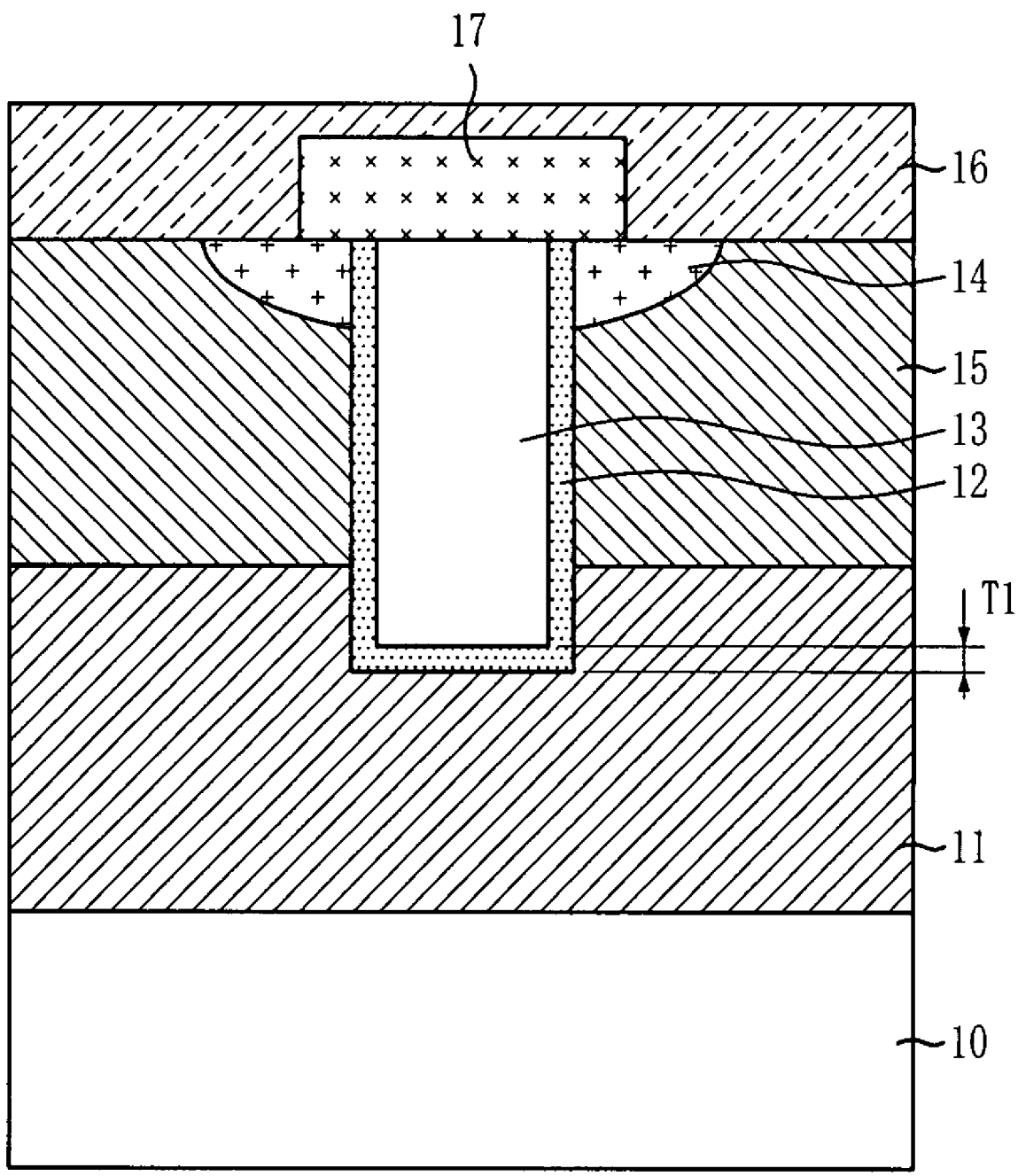
FIG. 1 illustrates a cross-sectional view of a typical double diffused metal-oxide semiconductor (DMOS) device.

A transistor having a recess channel and a fabricating method thereof in accordance with various embodiments of the present invention will be described in detail with reference to the accompanying drawings. Also, regarding the drawings, the illustrated thickness of layers and regions are exaggerated for definitude. When a first layer is referred to as being on a second layer or "on" a substrate, it could mean that the first layer is formed right on the second layer or the substrate, or it could also mean that a third layer may exit between the first layer and the substrate. Furthermore, the same or like reference numerals through out the various embodiments of the present invention represent the same or like elements in different drawings.

Figure 2:
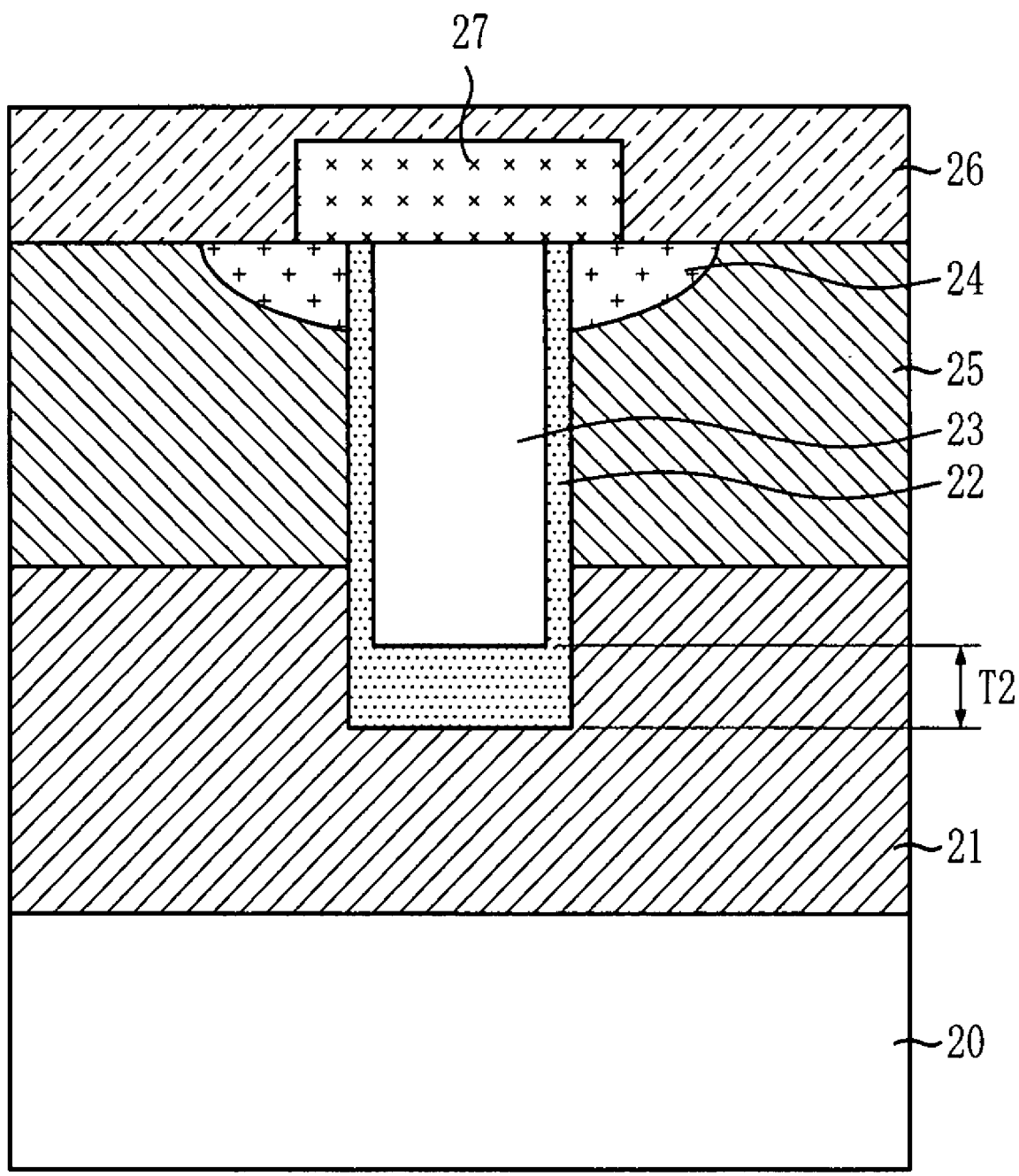
FIG. 2 illustrates a cross-sectional view of a DMOS device in accordance with an embodiment of the present invention.

FIG. 2 illustrates a cross-sectional view of a double diffused metal-oxide semiconductor (DMOS) device in accordance with an embodiment of the present invention. In this embodiment, a thickness of a gate oxide layer 22 formed at the bottom of a trench is selectively increased to overcome typical limitations. That is, a thickness 'T2' of the gate oxide layer 22 is increased to a larger thickness than a thickness 'T1' of a gate oxide layer 12 shown in FIG. 1. Reference numerals 20, 21, 23, 24, 25, 26, and 27 represent a doped $N^+$ substrate (drain) 20, an N-epitaxial layer 21 doped at a lower concentration than the substrate 20, a gate electrode 23 comprising a conductive polysilicon layer filled in a trench, an N+ doped source region 24 formed on both upper sides of the gate electrode 23, a P-well 25 formed below the N+ doped source region 24, a source metal layer 26 formed to cover the N+ doped source region 24, and a dielectric layer 27 formed below the source metal layer 26 to cover the gate electrode 23, respectively.

Figure 3A:
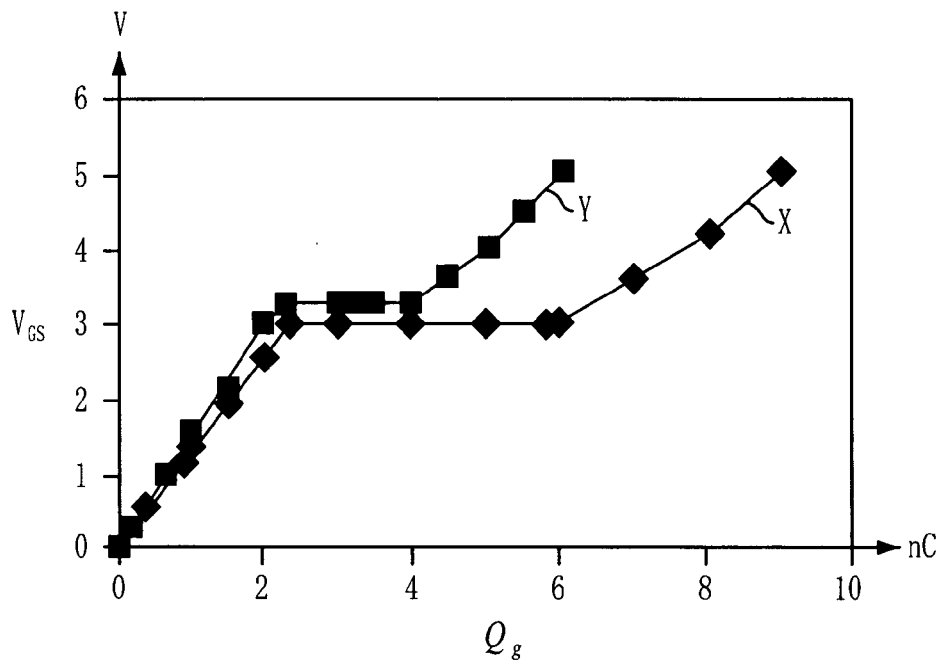
FIGS. 3A and 3B illustrate graphs comparing characteristics of the DMOS device shown in FIG. 1 and the DMOS device shown in FIG. 2.
Figure 3B:
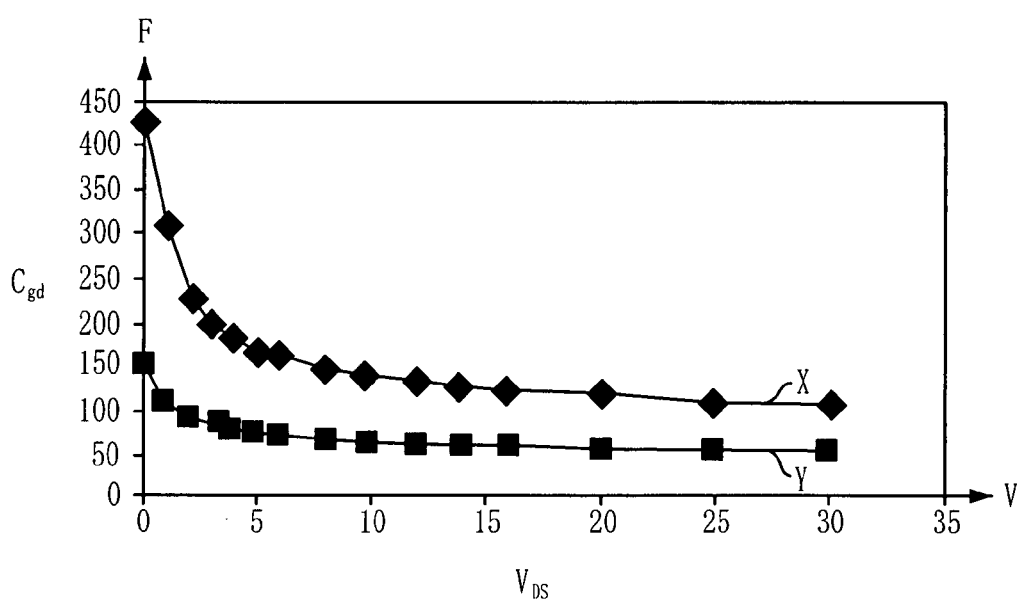

FIGS. 3A and 3B illustrate graphs comparing characteristics of the DMOS device shown in FIG. 1 and the DMOS device shown in FIG. 2. The graphs shown in FIGS. 3A and 3B compare characteristics of a gate oxide layer according to different thicknesses formed over a bottom portion of a trench. In each of the graphs, reference denotation 'X' represents characteristics of a gate oxide layer 12 of a typical device shown in FIG. 1, and reference denotation 'Y' represents characteristics of a gate oxide layer 22 of a device shown in FIG. 2 in accordance with the embodiment of the present invention.

Referring to FIG. 3A, 'X' shows smaller gate charge (Qg) to gate-source voltage ($V_{GS}$) when compared to 'Y'. Referring to FIG. 3B, 'X' shows greater gate-drain capacitance ($C_{gd}$) to drain-source voltage ($V_{DS}$) when compared to 'Y'. Thus, a gate capacitance may be reduced as a thickness of a gate oxide layer over a bottom portion of a trench increases.

Figure 4:
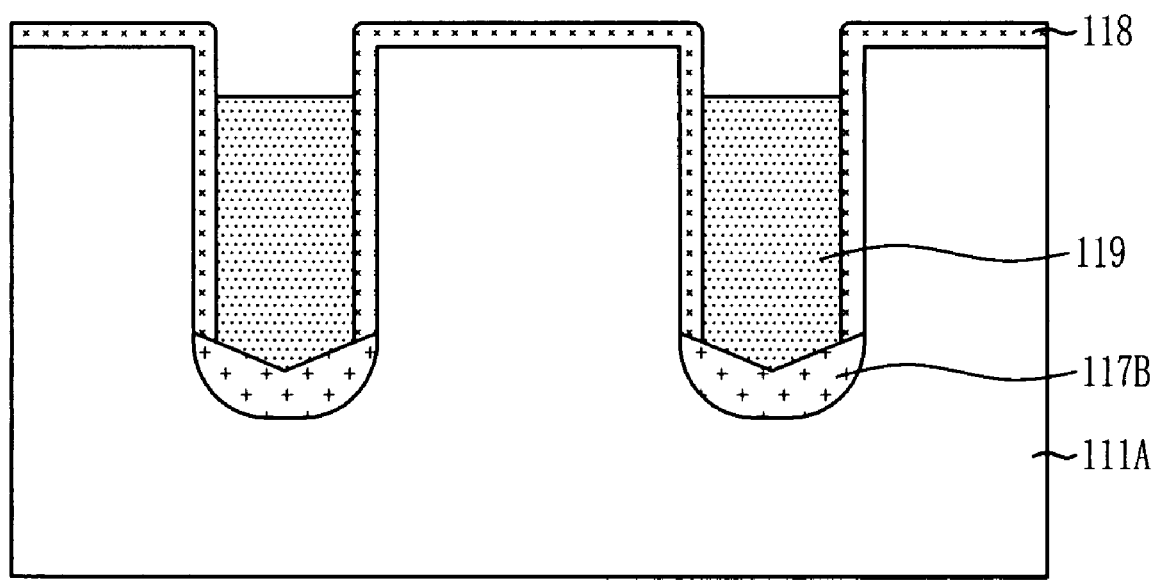
FIG. 4 illustrates a cross-sectional view of a DMOS device in accordance with an embodiment of the present invention.

FIG. 4 illustrates a cross-sectional view of a recess transistor in accordance with an embodiment of the present invention. In this drawing, gate electrodes of a DMOS device are mainly illustrated for convenience of description. The DMOS device according to the embodiment of the present invention includes insulation layers 117B formed on a bottom surface of trenches. The insulation layers 117B are formed in a 'V' shape, having a larger thickness in edge portions than a middle portion. Thus, a bottom portion of gate electrodes 119 is also formed in a 'V' shape. Reference numerals 111A and 118 refer to an epitaxial pattern 111A and gate insulation layers 118, respectively. The gate insulation layers 118 may include an oxide-based layer. Thus, the gate insulation layers 118 are referred to as the gate oxide layers 118 hereinafter.

A method for fabricating a DMOS device in accordance with an embodiment of the present invention is described hereinafter with reference to FIGS. 5A to 5H. Reference denotation 'A' represents a cell array region and reference denotation 'B' represents a gate bus region.

Figure 5A:
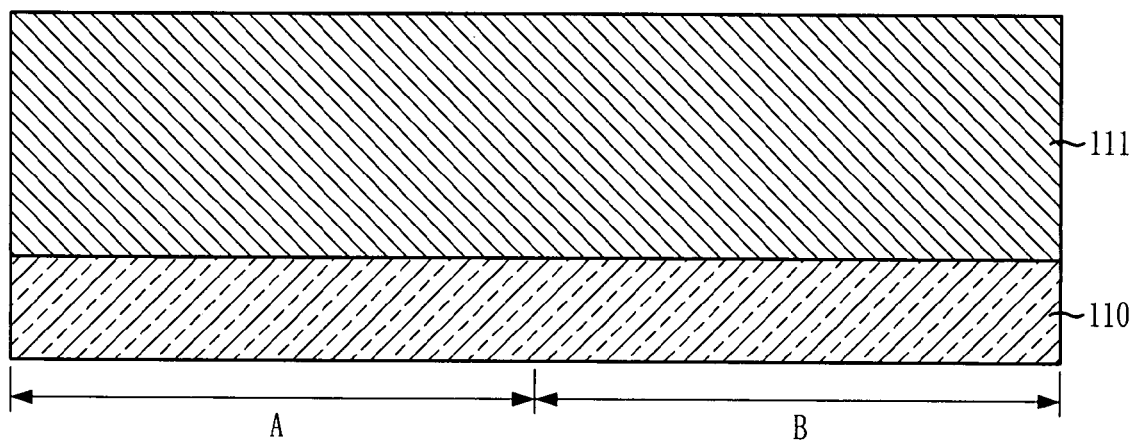
FIGS. 5A to 5H illustrate a method for fabricating a DMOS device in accordance with an embodiment of the present invention.

Referring to FIG. 5A, an N- or P-epitaxial layer 111 is formed over a substrate 110. The substrate 110 may include silicon.

Figure 5B:
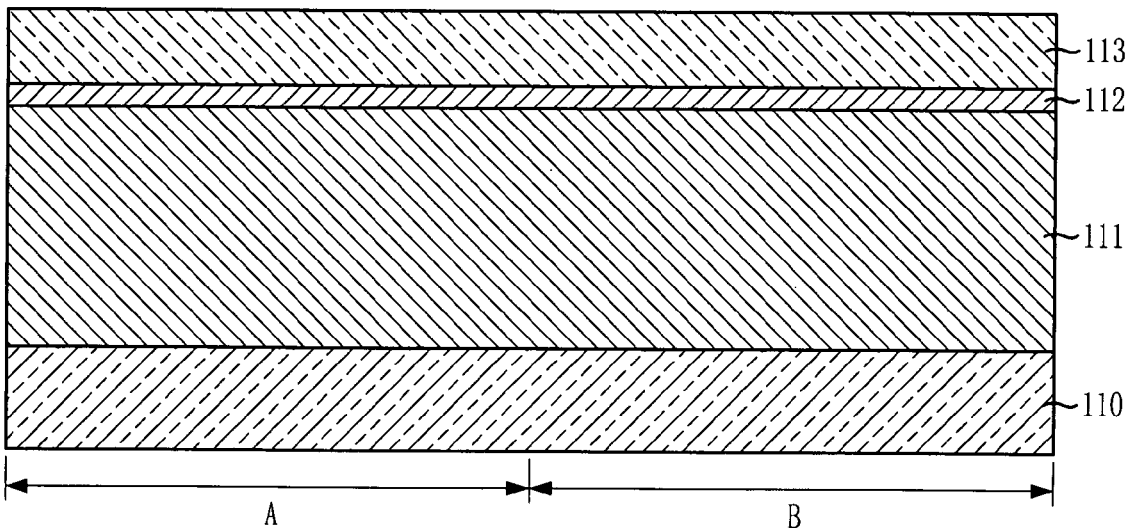

Referring to FIG. 5B, a nitride-based layer 112 and an oxide-based layer 113 are formed over the epitaxial layer 111. The nitride-based layer 112 and the oxide-based layer 113 are formed as a hard mask for forming a trench. At this time, the nitride-based layer 112 may include silicon nitride ($Si_3N_4$) or silicon oxynitride (SiON). Also, other nitride-based materials may also be used as the nitride-based layer 112. The oxide-based layer 113 may include a high temperature low pressure dielectric (HLD) layer. The oxide-based layer 113 may include high density plasma (HDP), borophosphosilicate glass (BPSG), phosphosilicate glass (PSG), tetraethyl orthosilicate (TEOS), or undoped silicate glass.

Meanwhile, a buffer oxide layer (not shown) may be formed before the nitride-based layer 112 is formed. At this time, the buffer oxide layer may include a silicon oxide ($SiO_2$) layer.

Figure 5C:
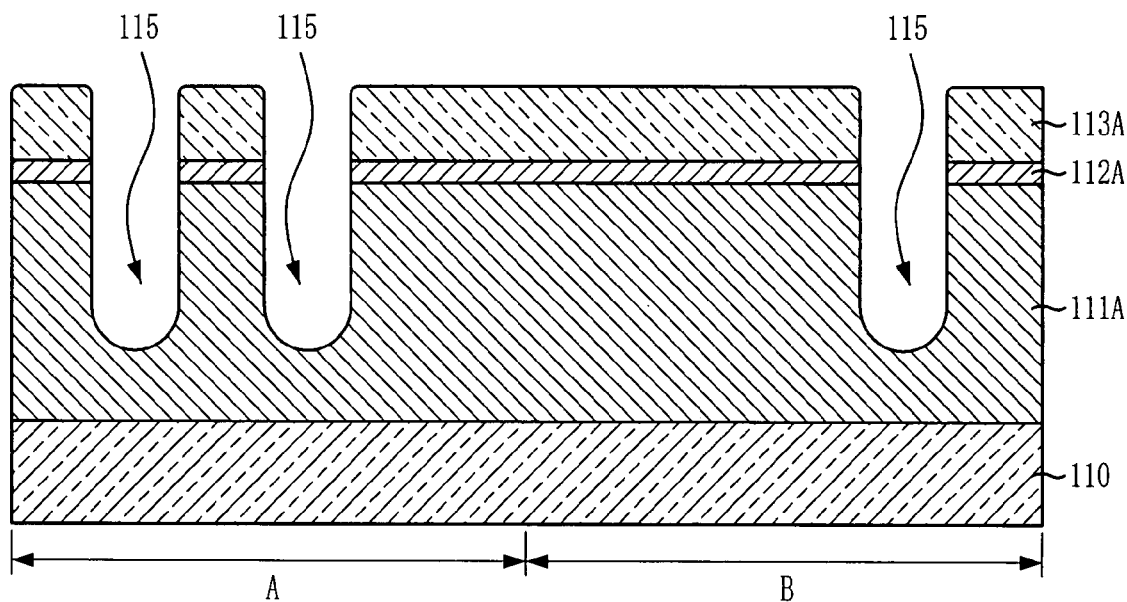

Referring to FIG. 5C, a photoresist pattern (not shown) is formed over the oxide-based layer 113 (FIG. 5B). The oxide-based layer and the nitride-based layer 112 (FIG. 5B) are etched using the photoresist pattern as an etch mask.

The photoresist pattern is removed. The epitaxial layer 111 (FIG. 5B) is then etched to a certain thickness using an oxide-based pattern 113A and a nitride-based pattern 112A as an etch mask. Thus, trenches 115 are formed in the epitaxial layer 111. The remaining epitaxial layer 111 is referred to as an epitaxial pattern 111A. At this time, the trenches 115 has a depth ranging from approximately 1.2 μm to approximately 2.0 μm. For instance, the depth of the trenches 115 may be approximately 1.7 μm. The trenches 115 has a width ranging from approximately 0.38 μm to approximately 0.47 μm. For instance, the width of the trenches 115 may be approximately 0.4 μm. Meanwhile, although the trenches 115 are illustrated as if the trenches 115 are isolated, the trenches 115 are actually coupled to each other. The trenches 115 are illustrated as so for convenience of description.

Figure 5D:
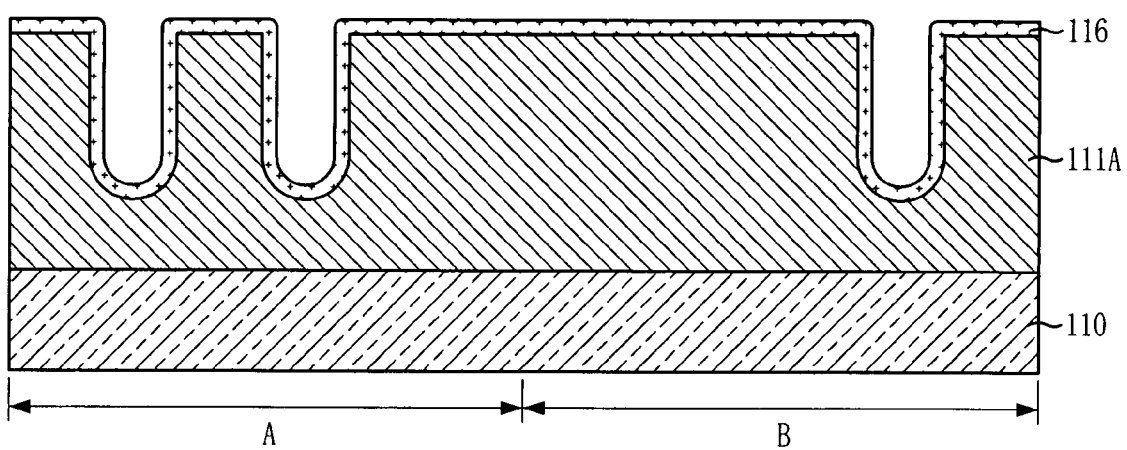

Referring to FIG. 5D, an oxidation process is performed to form a first sacrificial oxide layer (not shown) over an exposed inner surface of the trenches 115. At this time, the oxidation process includes a dry oxidation process. The dry oxidation process is performed until the first sacrificial oxide layer reaches a thickness ranging from approximately 150 Å to approximately 250 Å by supplying oxygen ($O_2$) gas into a chamber maintaining a temperature ranging from approximately 1,000° C. to approximately 1,200° C., and then adding nitrogen ($N_2$) gas into the chamber. For instance, the thickness of the first sacrificial oxide layer may be approximately 200 Å and the temperature may be approximately 1,100° C. The $N_2$ gas is added during the dry oxidation process to decrease an oxidation rate during the oxidation process such that an oxidation time increases, resulting in an oxide-based layer with high density.

The first sacrificial oxide layer is removed, and a second sacrificial oxide layer 116 is formed. The second sacrificial oxide layer 116 may be formed through substantially the same method as the formation method for the first sacrificial oxide layer.

Figure 5E:
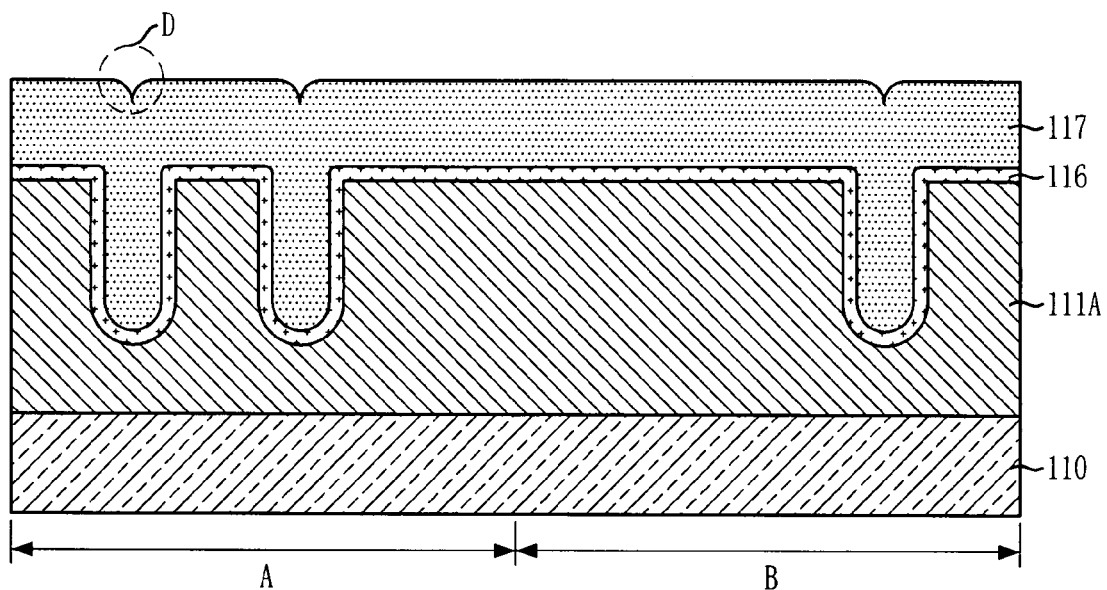

Referring to FIG. 5E, an undoped polysilicon layer 117 is formed over the resultant structure and filled in the trenches 115 (FIG. 5C). The undoped polysilicon layer 117 includes an insulation material and is not doped with impurities. At this time, the undoped polysilicon layer 117 is formed in a manner that the undoped polysilicon layer 117 has a depression 'D' over a middle portion of the trenches 115 rather than edge portions of the trenches 115. The depression 'D' formed over the middle portion of the trenches 115 may be naturally generated by a height difference of the trenches 115. The depression 'D' may be artificially formed by controlling process conditions if the depression 'D' is not naturally generated.

Figure 5F:
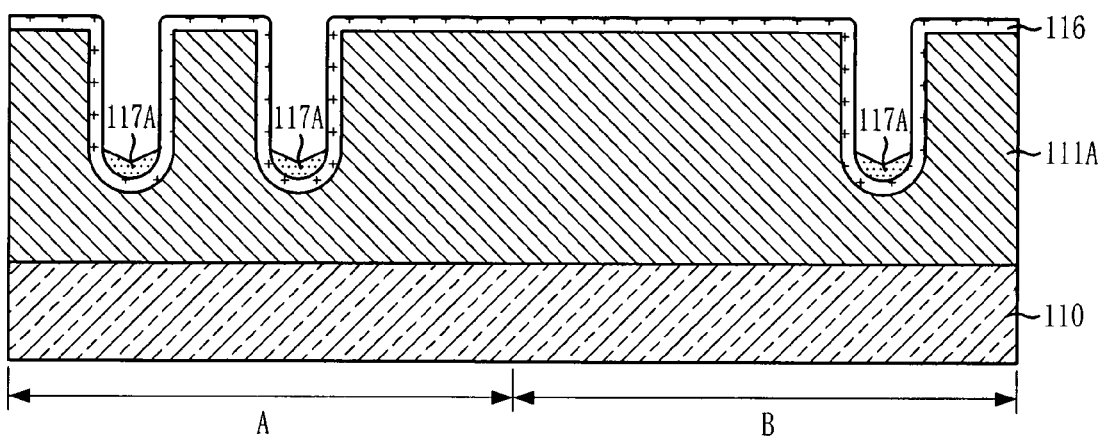

Referring to FIG. 5F, an etch-back process is performed to etch the undoped polysilicon layer 117 (FIG. 5E). Thus, filling layers 117A are filled in the trenches 115 (FIG. 5C) to a certain depth. The filling layers 117A have a 'V' shape, having a larger thickness in edge portions than a middle portion. For instance, the filling layers 117A may have a thickness ranging from approximately 2,000 Å to approximately 3,000 Å. At this time, the etch-back process is performed in a manner that the filling layers 117A obtain the 'V' shape. Accordingly, the etch-back process includes performing an anisotropic etch process with straightness such that the depression 'D' (FIG. 5E) formed over the middle portion of the trenches 115 is maintained. For instance, the etch-back process is performed at a pressure ranging from approximately 0.4 Pa to approximately 0.6 Pa at a temperature ranging from approximately 500° C. to approximately 800° C.

using sulfur hexafluoride ($SF_6$) gas. The pressure may be approximately 0.5 Pa and the temperature may be approximately 650° C.

Figure 5G:
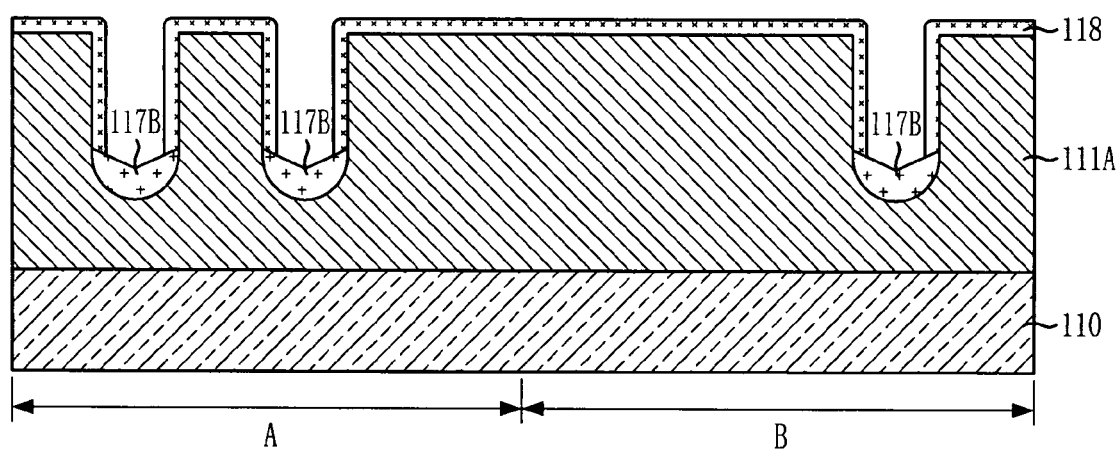

Referring to FIG. 5G, the second sacrificial oxide layer 116 is removed. An oxidation process is then performed to oxidize the filling layers 117A such that insulation layers 117B are formed. Also, gate oxide layers 118 are formed over inner sidewalls of the trenches 115 (FIG. 5C) at substantially the same time. The oxidation process uses $N_2$ gas and $O_2$ gas having a ratio of approximately 20:4 (SLPM) at a temperature ranging from approximately 1,000° C. to approximately 1,200° C. For instance, the oxidation process may be performed at a temperature of approximately 1,050° C.

Figure 5H:
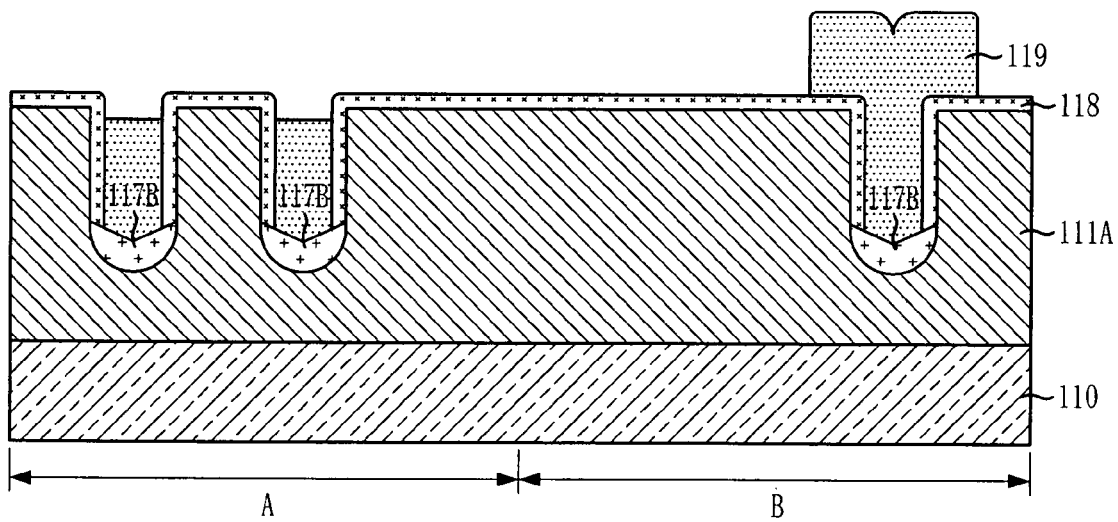

Referring to FIG. 5H, a polysilicon layer is formed as a gate conductive layer to fill the trenches 115 (FIG. 5C). The polysilicon layer is then etched to form gate electrodes 119.

Following benefits may be obtained from the embodiments of the present invention. In accordance with the embodiments of the present invention, a gate capacitance may be decreased by forming the insulation layer in the 'V' shape, having the larger thickness over the edge portions of the bottom surface of the trenches when compared to the thickness over the middle portion. Thus, the switching speed of the device may improve.

In accordance with the embodiments of the present invention, leakage current may be decreased by forming the insulation layer in the 'V' shape, having the larger thickness over the edge portions of the bottom surface of the trenches when compared to the thickness over the middle portion. The leakage current is often generated in a typical device due to an insulation layer having a small thickness formed over edge portions of a bottom surface of a trench.

In accordance with the embodiments of the present invention, expensive apparatuses such as a high density plasma chemical vapor deposition (HDP-CVD) apparatus may not be required by forming the polysilicon layer to fill a portion of the trenches and then oxidizing the polysilicon layer to form the insulation layer having the 'V' shape. Thus, fabrication cost may decrease.

While the aforementioned technological concept of the present invention has been described with respect to the exemplary embodiments, the embodiments are shown for description and not for limitation. Although the embodiments of the present invention have described the DMOS device as an example, this invention can be applied in other transistors having a recess channel (trench structure). It will be apparent to those skilled in the art that various changes and modifications may be made without departing from the spirit and scope of the invention as defined in the following claims.

What is claimed is:

1. A method for fabricating a transistor, comprising:
   forming a trench in a substrate;
   forming a polysilicon layer over the substrate and filled in the trench;
   etching the polysilicon layer in a manner that a portion of the polysilicon layer having a greater thickness over an edge portion of a bottom surface of the trench than over a middle portion of the bottom surface of the trench remains in the trench;
   oxidizing the entire remaining portion of the polysilicon layer to form an insulation layer over the bottom surface of the trench and forming a gate insulation layer over inner sidewalls of the trench to a smaller thickness than the insulation layer at substantially the same time; and
   forming a gate electrode over the insulation layer and filled in the trench.

2. The method of claim 1, wherein forming the polysilicon layer comprises forming an undoped polysilicon layer which is not doped with impurity ions.

3. The method of claim 1, wherein forming the polysilicon layer comprises forming the polysilicon layer in a manner that a depression is generated over a middle portion of the trench.

4. The method of claim 1, wherein etching the polysilicon layer in the manner that the portion of the polysilicon layer remains in the trench comprises performing an etch-back process.

5. The method of claim 4, wherein the etch-back process comprises performing the etch-back process at a pressure ranging from approximately 0.4 Pa to approximately 0.6 Pa at a temperature ranging from approximately 500° C. to approximately 800° C. using sulfur hexafluoride ($SF_6$) gas.

6. The method of claim 1, wherein oxidizing the remaining portion of the polysilicon layer to form the insulation layer and forming the gate insulation layer over the inner sidewalls of the trench comprise using nitrogen ($N_2$) gas and oxygen ($O_2$) gas mixed at a ratio of approximately 20:4 (SLPM) at a temperature ranging from approximately 1,000° C. to approximately 1,200° C.

7. The method of claim 1, further comprising, after forming the trench:
   oxidizing inner surfaces of the trench to form a first sacrificial oxide layer;
   removing the first sacrificial oxide layer; and
   forming a second sacrificial oxide layer.

8. The method of claim 7, further comprising, after etching the polysilicon layer in the manner that the portion of the polysilicon layer remains in the trench, removing the second sacrificial oxide layer.

9. The method of claim 1, wherein the insulation layer has a thickness ranging from approximately 2,000° C. to approximately 3,000° C.

10. The method of claim 1, wherein the substrate comprises:
    a silicon substrate; and
    an epitaxial layer formed over the silicon substrate.

* * * * *